US007852682B2

(12) United States Patent
Byeon et al.

(10) Patent No.: US 7,852,682 B2
(45) Date of Patent: Dec. 14, 2010

(54) FLASH MEMORY DEVICE AND PROGRAM METHOD OF FLASH MEMORY DEVICE USING DIFFERENT VOLTAGES

(75) Inventors: Dae-Seok Byeon, Yongin-si (KR); Young-Ho Lim, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 805 days.

(21) Appl. No.: 11/830,260

(22) Filed: Jul. 30, 2007

(65) Prior Publication Data

US 2008/0049502 A1 Feb. 28, 2008

(30) Foreign Application Priority Data

Jul. 31, 2006 (KR) ...................... 10-2006-0072189

(51) Int. Cl.
*G11C 16/06* (2006.01)

(52) U.S. Cl. ............................ 365/185.23; 365/185.18; 365/189.09

(58) Field of Classification Search ............ 365/185.05, 365/185.18, 185.23, 185.24, 185.25, 189.09
See application file for complete search history.

(56) References Cited

U.S. PATENT DOCUMENTS

| | | | | |
|---|---|---|---|---|
| 5,621,684 | A | 4/1997 | Jung | |
| 5,677,873 | A | 10/1997 | Choi et al. | |
| 5,715,194 | A | 2/1998 | Hu | |
| 5,991,202 | A | 11/1999 | Derhacobian et al. | |
| 6,061,270 | A | 5/2000 | Choi | |
| 6,259,624 | B1 | 7/2001 | Nobukata | |
| 6,614,688 | B2 | 9/2003 | Jeong et al. | |
| 6,987,694 | B2 | 1/2006 | Lee | |
| 7,170,793 | B2 | 1/2007 | Guterman | |
| 7,486,557 | B2 * | 2/2009 | Kim et al. | 365/185.11 |
| 7,617,335 | B2 * | 11/2009 | Choi | 710/8 |
| 7,636,265 | B2 * | 12/2009 | Park et al. | 365/189.16 |

FOREIGN PATENT DOCUMENTS

| | | |
|---|---|---|
| JP | 08-279297 | 10/1996 |
| JP | 2000-048581 | 2/2000 |
| JP | 2002-245785 | 8/2002 |
| JP | 2004-014052 | 1/2004 |
| KR | 10-1997-0051324 | 7/1997 |
| KR | 100145475 B1 | 4/1998 |
| KR | 10-2002-0047770 | 6/2002 |
| KR | 1020020054511 A | 7/2002 |
| KR | 10-2004-0090841 | 10/2004 |
| KR | 10-0621634 | 8/2006 |
| KR | 10-2006-0114736 | 11/2006 |

* cited by examiner

*Primary Examiner*—Gene N. Auduong
(74) *Attorney, Agent, or Firm*—Volentine & Whitt, PLLC

(57) ABSTRACT

A flash memory and a program method of the flash memory include applying a pass voltage to word lines to boost a channel voltage, which is discharged to a ground voltage. A program voltage is applied to a selected word line and a local voltage is applied to at least one word line supplied with the pass voltage while the program voltage is being applied to the selected word line. The local voltage is lower than the pass voltage and equal to or higher than the ground voltage. The boosted channel voltage may be discharged before the program voltage is applied to the selected word line.

34 Claims, 11 Drawing Sheets

FLASH MEMORY DEVICE AND PROGRAM METHOD OF FLASH MEMORY DEVICE USING DIFFERENT VOLTAGES

CROSS-REFERENCE TO RELATED APPLICATIONS

A claim of priority is made to Korean Patent Application No. 10-2006-0072189, filed on Jul. 31, 2006, the subject matter of which is hereby incorporated by reference.

BACKGROUND OF THE INVENTION

1. Field of the Invention

The present invention relates to a non-volatile semiconductor memory device and, more particularly, to a flash memory device and a program method of the flash memory device in which a program voltage is applied to a selected word line while a local voltage is applied another word line.

2. Description of the Related Art

A flash memory device known as a flash Electrically Erasable and Programmable Read Only Memory (EEPROM) has a memory cell array that may include memory cells having floating gate transistors. The memory cell array may consist of memory blocks, each of which includes bit lines arranged in parallel and multiple strings (e.g., referred to as "NAND strings") respectively corresponding to the bit lines. Each of the strings has a string select transistor, a ground select transistor and multiple floating gate transistors connected in series between the select transistors. The multiple floating gate transistors in each string are formed on the same substrate, and are configured to share a source-drain terminal with adjacent floating gate transistors. Multiple word lines are arranged so that they intersect with the strings. Each word line is connected to control gates of the multiple floating gate transistors in each of corresponding rows.

In order to program memory cells having floating gate transistors, the memory cells are first erased to have a given threshold voltage (e.g., −3V). A program operation may then be carried out with respect to selected memory cells by applying a high voltage (e.g., 20V) to a word line connected to the selected memory cells. During the program operation, threshold voltages of the selected memory cells may be shifted to a higher threshold voltage, while threshold voltages of unselected memory cells may remain unchanged.

However, because control gates of the floating gate transistors in the same row are connected to a corresponding word line, a program voltage may be applied to both selected and unselected memory cells when the program voltage is applied to a selected word line. Accordingly, the unselected memory cells positioned along the same word line, especially memory cells adjacent to the selected word line, may be unintentionally programmed. Unintended programming of unselected memory cells may be called "program disturbance."

Techniques for preventing program disturbance may include, for example, program-inhibit methods using a self-boosting scheme and a local self-boosting scheme. Exemplary program-inhibit methods using a self-boosting scheme are disclosed in U.S. Pat. No. 5,677,873, entitled "METHODS OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN," and U.S. Pat. No. 5,991,202, entitled "METHOD FOR REDUCING PROGRAM DISTURB DURING SELF-BOOSTING IN A NAND FLASH MEMORY." Exemplary program-inhibit methods using a local self-boosting scheme are disclosed in U.S. Pat. No. 5,715,194, entitled "BIAS SCHEME OF PROGRAM INHIBIT FOR RANDOM PROGRAMMING IN A NAND FLASH MEMORY," and U.S. Pat. No. 6,061,270, entitled "METHOD FOR PROGRAMMING A NON-VOLATILE MEMORY DEVICE WITH PROGRAM DISTURB CONTROL." The program-inhibit method using the local self-boosting scheme may be suitable for increasing a channel boosting voltage of a program-inhibited memory cell transistor, as compared to the program-inhibit method using the self-boosting scheme. Therefore, the program-inhibit method using the local self-boosting scheme has been widely used to program multi-level cells.

However, despite utilization of the above-referenced program-inhibit methods, program disturbance remains a factor as flash memory devices become more highly integrated. This is because the intervals between memory cells and between signal lines are reduced when the degree of integration increases. In other words, the probability increases that coupling may arise. As a result, the program disturbance may affect not only selected memory cells and unselected memory cells in the same word line, but also memory cells in the same string as selected memory cells.

SUMMARY OF THE INVENTION

An aspect of the present invention provides a program method of a flash memory device. The method includes applying a pass voltage to word lines to boost a channel voltage and discharging the channel voltage boosted by the pass voltage. A program voltage is applied to a selected word line of the word lines, and a local voltage is applied to at least one word line of the word lines supplied with the pass voltage, while the program voltage is applied to the selected word line. The local voltage is lower than the pass voltage and equal to or higher than a ground voltage.

Before applying of the pass voltage, the ground voltage may be applied to a selected bit line and a power supply voltage may be applied to an unselected bit line. The boosted channel voltage may be discharged to the ground voltage before the program voltage is applied to the selected word line. Also, the at least one word line to which the local voltage is applied may include a word line adjacent to the selected word line and/or at least one word line positioned below the selected word line.

Applying the local voltage in the program method may further include initially lowering the pass voltage to a level lower than the local voltage, and increasing the lowered voltage to the local voltage to apply to the at least one word line. The lowered voltage may be lower than the local voltage and equal to or higher than the ground voltage. Also, applying the local voltage to the at least one word line may include applying a first local voltage having a first voltage level to a first word line, and applying a second local voltage having a second voltage level, different from the first voltage level, to a second word line, or applying the local voltage having the same voltage level to a first word line and a second word line.

Applying the pass voltage to the word lines may include applying the pass voltage to at least one of the word lines at a pass voltage level different than a pass voltage level applied to at least one other word line. The pass voltage applied to the selected word line may be at a pass voltage level lower than or equal to a pass voltage level applied the other word lines. Also, the pass voltage applied to the selected word line may equal to or higher than the ground voltage. Alternatively, the pass voltage level of the pass voltage applied to the word lines may the same for each of the word lines. The pass voltage may be continuously applied to word lines positioned over the selected word line.

When the selected word line is an uppermost word line in a string, the program method may further include supplying a first string select transistor adjacent to the selected word line with a voltage higher than a power supply voltage and lower than the pass voltage before applying the program voltage, and supplying a second string select transistor adjacent to the first string select transistor with the power supply voltage. When the selected word line is a lowermost word line in a string, the program method may further include supplying a first ground select transistor adjacent to the selected word line with a voltage higher than the ground voltage and lower than the pass voltage before applying the program voltage, and supplying a second ground select transistor adjacent to the first ground select transistor with the ground voltage.

Another aspect of the present invention provides a flash memory device, including a memory cell array, a control circuit, a high voltage generator circuit and a row selector circuit. The memory cell array includes multiple memory cells positioned at intersections of multiple bit lines and multiple word lines. The control circuit controls generation and application of high voltages to the memory cell array. The high voltage generator circuit generates the high voltages in response to the control circuit. The generated high voltages include a program voltage, a pass voltage lower than the program voltage, and a local voltage lower than the pass voltage and higher than or equal to a ground voltage. The row selector circuit applies the high voltages to the memory cell array in response to the control circuit. Applying the high voltages includes applying the pass voltage to the multiple word lines to boost a channel voltage, applying the program voltage to a selected word line after the boosted channel voltage is discharged, and applying a local voltage to at least one word line of the word lines while the program voltage is applied. The local voltage may be lower than the pass voltage and equal to or higher than the ground voltage.

The flash memory device may also include a column selector circuit for applying the ground voltage to a selected bit line and a power supply voltage to an unselected bit line before the pass voltage is applied. The memory cell array may further include multiple strings, each string including memory cells that share a source-drain terminal and that are turned on in response to the pass voltage before the program voltage is applied. Also, before the program voltage is applied, a boosted result of a memory cell connected to the selected word line may be discharged via a channel of an adjacent memory cell sharing the source-drain terminal. Applying the local voltage to the at least one word line may include applying the local voltage to one or more word lines positioned below the selected word line.

BRIEF DESCRIPTION OF THE DRAWINGS

The embodiments of the present invention will be described with reference to the attached drawings, in which.

DETAILED DESCRIPTION OF THE EMBODIMENTS

Figure 1:
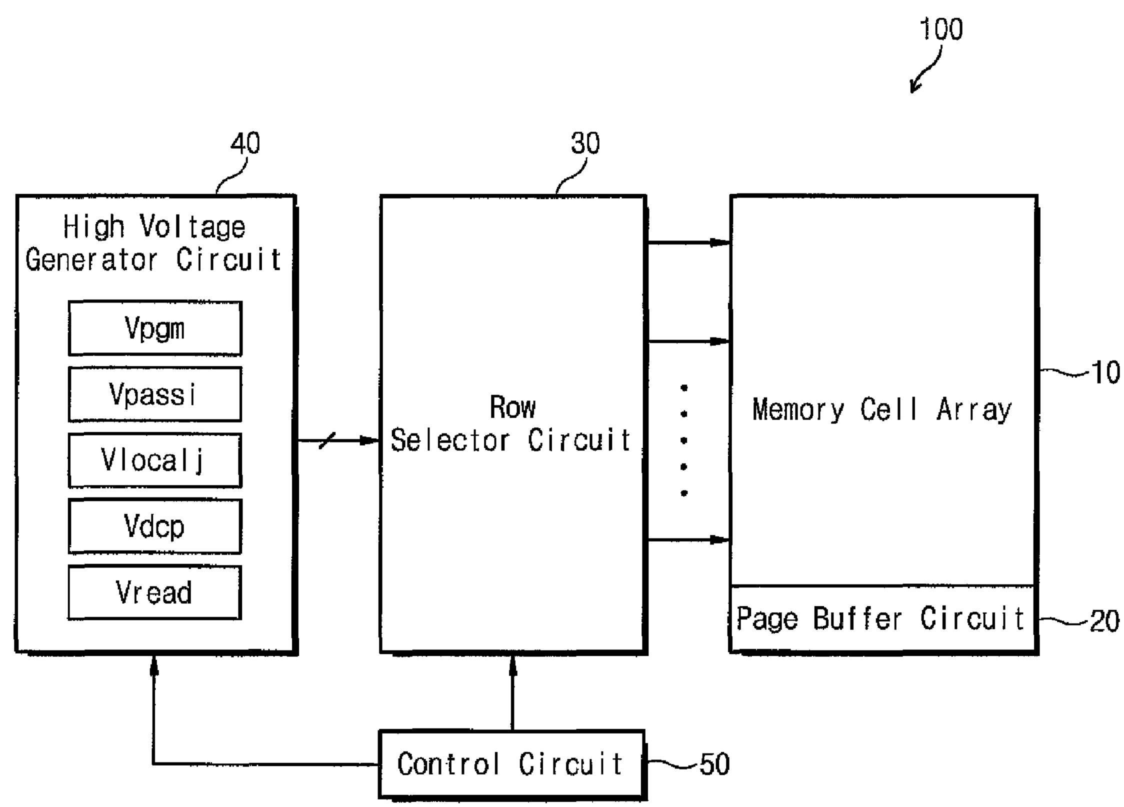
FIG. 1 is a block diagram showing a flash memory device, according to an exemplary embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

A flash memory device according to an embodiment of the present invention may be configured to apply a pass voltage Vpass or Vpassi (where i is a positive integer) to multiple word lines, including a selected word line, when a program operation commences. Subsequently, a program voltage Vpgm is applied to the selected word line, and a local voltage Vlocal or Vlocalj (where j is a positive integer) is applied to at least one or more word lines adjacent to the selected word line. The local voltage Vlocal is lower than the pass voltage Vpass and higher than or equal to a ground voltage. With this bias condition, no potential difference between a channel of a memory cell to be programmed and a channel of an adjacent memory cell arises, preventing program disturbance, such as soft programming.

Figure 2:
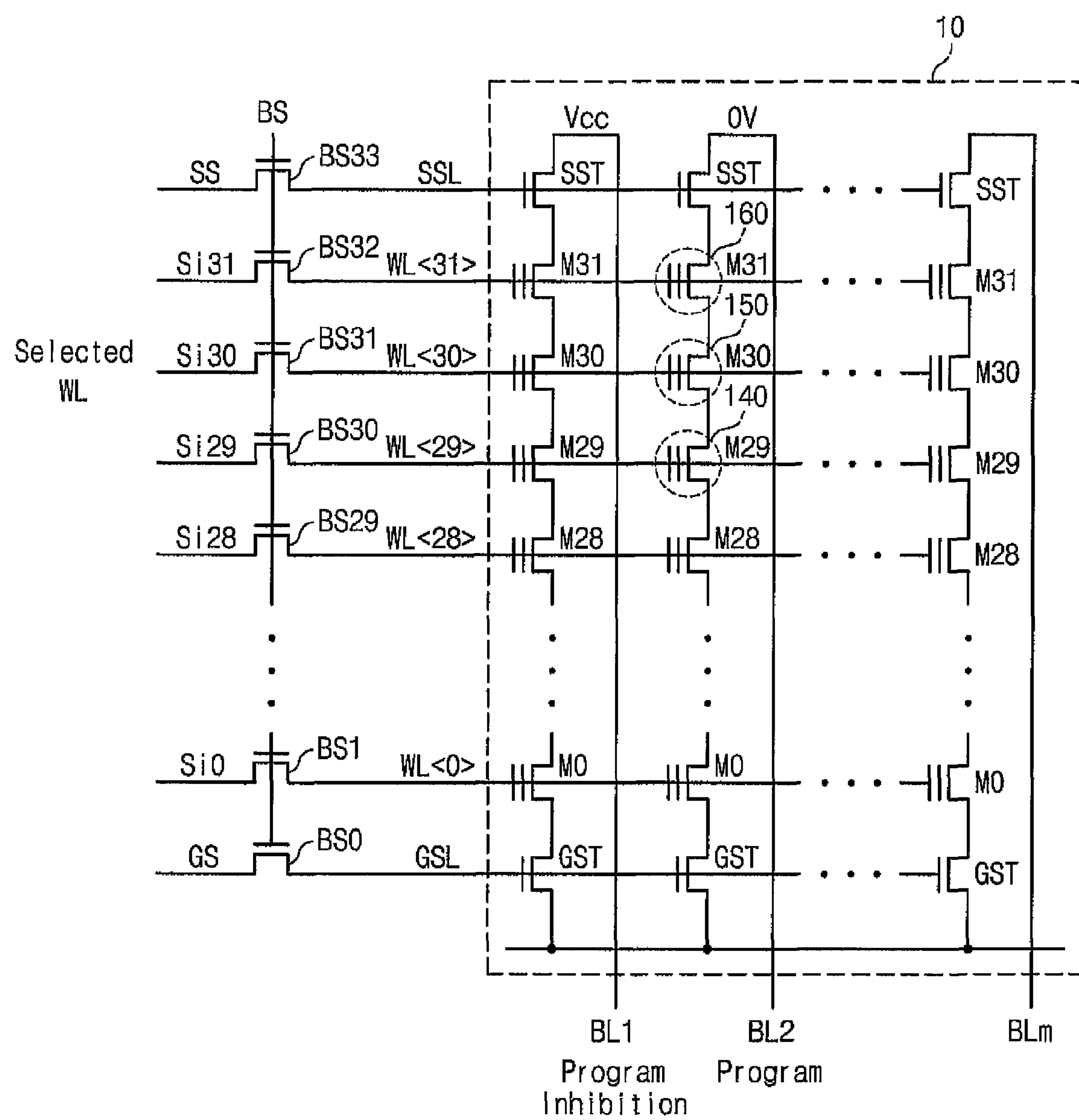
FIG. 2 is a circuit diagram showing a memory cell array illustrated in FIG. 1, according to an exemplary embodiment of the present invention.

FIG. 1 is a block diagram showing a flash memory device according to an exemplary embodiment of the present invention, and FIG. 2 is a circuit diagram showing a memory cell array illustrated in FIG. 1.

Referring to FIGS. 1 and 2, a flash memory device 100 according to the depicted embodiment includes a memory cell array 10, a page buffer circuit 20, a row selecting circuit 30, a high voltage generator circuit 40 and a control circuit 50.

The memory cell array 10 may include multiple memory blocks, and multiple bit lines BL1 to BLm connected to the memory blocks. Each of the memory blocks may have multiple strings (e.g., NAND strings) corresponding to the bit lines BL1 to BLm. FIG. 2 illustrates the strings in three exemplary memory blocks, corresponding to the bit lines BL1, BL2 and BLm.

Referring to FIG. 2, each string includes a string select transistor SST, a ground select transistor GST, and multiple (e.g., 32) floating gate transistors M0 to M31 connected in series between a source of the string select transistor SST and a drain of the ground select transistor GST. Each of the floating gate transistors M0 to M31 may be used to store data. A drain of the string select transistor SST in each string is connected to a corresponding bit line, and a source of the ground select transistor GST is connected to a common source line (e.g., a common signal line) CSL.

Gates of string select transistors SST in each string are commonly connected to a string select line SSL, and gates of ground select transistors GST in each string are commonly connected to a ground select line GSL. Control gates of floating gate transistors M0 to M31 in each string are connected to corresponding word lines WL<0> to WL<31>, respectively. In an embodiment, each string may include two or more ground select transistors and two or more string select transistors, for example, depending on the manner of driving circuits and/or the manner of applying voltages used for a program operation.

Each of the bit lines BL1 to BLm is connected to a page buffer circuit 20. The ground select line GSL, the word lines WL<0> to WL<31>, and the string select line SSL are connected to corresponding signal lines GS, Si0 to Si31, and SS via corresponding block select transistors BS0 to BS33, respectively. The block select transistors BS0 to BS33 may be included in a row decoder circuit (not pictured) of the flash memory device and commonly controlled by a block select control signal BS. The select signal lines GS, Si0 to Si31, and SS may be driven by corresponding select circuits or driver circuits when a program operation is carried out. In this case, a selected block select control signal BS may be configured to have a high voltage level, in order to adequately transfer a program voltage Vpgm, a pass voltage Vpass or a local voltage Vlocal applied via the select signal lines Si0 to Si31 to the corresponding word lines WL<0> to WL<31>, respectively.

Referring again to FIG. 1, the page buffer circuit 20 may be configured to store data in memory cells and to read data from the memory cells. The page buffer circuit 20 may be connected to the memory cell array 10 via the bit lines BL1 to BLm shown in FIG. 2. Although not shown in figures, the page buffer circuit 20 may include multiple page buffers corresponding to the respective bit lines BL1 to BLm. Each of the page buffers may be configured to store data to be programmed in a memory cell or data read out from a memory cell. The page buffer circuit 20 may apply a ground voltage or a power supply voltage to a bit line according to data stored in each page buffer. For example, a ground voltage may be supplied to a bit line connected to a page buffer that stores data "0" (or connected to a memory cell to be programmed). A power supply voltage may be supplied to a bit line connected to a page buffer that stores data "1" (or connected to a memory cell to be program-inhibited).

A flash memory device may perform a program operation after memory cells are erased. Erased memory cells may store data "1". Accordingly, data "1" stored in a page buffer means that a corresponding memory cell is a memory cell to be program-inhibited. Data "0" stored in a page buffer means that a corresponding memory cell is a memory cell to be programmed. In an embodiment, a column selector circuit (not pictured) may be incorporated to apply the ground voltage to a selected bit line and the power supply voltage to an unselected bit line, e.g., before the pass voltage Vpass is applied.

The control circuit 50 may be configured to control a high voltage generator circuit 40 and a row selector circuit 30. The high voltage generator circuit 40 generates high voltages, used for a read or program operation, such as a program voltage Vpgm, a pass voltage Vpassi, a local voltage Vlocalj, a read voltage Vread, decoupling voltage Vdcp, and the like. The program voltage Vpgm is a voltage applied to a selected word line during a program operation, and has a high voltage level close to 20V, for example. The pass voltage Vpassi is lower than the program voltage Vpgm and higher than the local voltage Vlocalj. In an embodiment, before applying of the program voltage Vpgm after a program operation starts, the pass voltage Vpassi may be supplied simultaneously to all word lines in the same string. The pass voltage Vpassi may be generated to have a single voltage level or multiple different voltage levels.

The local voltage Vlocalj is a voltage used to localize a boosting region that is program-inhibited and is applied to at least one or more word lines adjacent to a selected word line. The local voltage Vlocalj is lower than a pass voltage Vpass and higher than or equal to a ground voltage. A power supply voltage or a read voltage Vread may be used instead of the local voltage Vlocalj. However, the local voltage Vlocalj is not limited to this exemplary disclosure. For example, it is possible to use a local voltage Vlocalj having various levels that satisfy a range of the above-described local voltage, without departing from the spirit and scope of the present invention. That is, the local voltage Vlocalj may be generated to have a single voltage level or different voltage levels. Therefore, multiple local voltages Vlocalj applied to the same string during programming may have the same level or different voltage levels. Also, in alternative embodiments, the local voltage Vlocalj may be applied to at least one or more word lines not immediately adjacent to the selected word line, discussed below.

The row selector circuit 30 may be configured to decode a row address, to select a word line corresponding to the decoded result, and to apply the selected word line and word lines adjacent to the selected word line with corresponding voltages, under the control of the control circuit 50. According to the present embodiment, when a program operation starts, the row selector circuit 30 may be configured to apply the pass voltage Vpass or Vpassi to multiple word lines, including a selected word line, in response to the control of the control circuit 50. For example, the row selector circuit 30 may apply a program voltage Vpgm to the selected word line and the local voltage Vlocalj to at least one or more word lines adjacent to the selected word line. During a program interval, the pass voltage Vpass or Vpassi may be applied continuously to the remaining word lines.

By applying word line voltages in this manner during programming, there is no potential difference between a channel of a selected memory cell and channels of adjacent memory cells. Accordingly, it is possible to prevent memory cells from being soft programmed due to a potential difference between channels. The reliability (e.g., the programming accuracy) of the flash memory device is thus improved.

Figure 3:
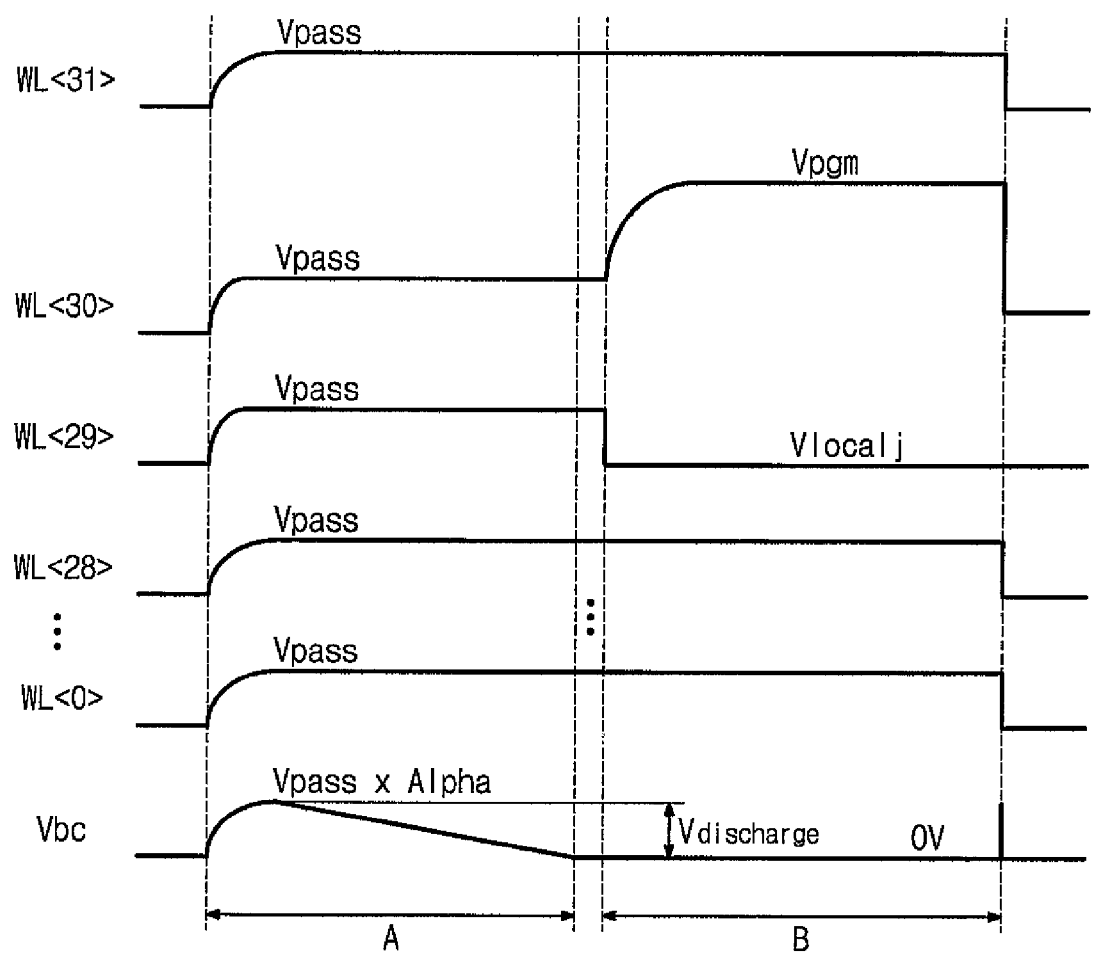
FIG. 3 is a diagram showing a word line voltage application method of a flash memory device for program operation, according to an exemplary embodiment of the present invention.
Figure 4:
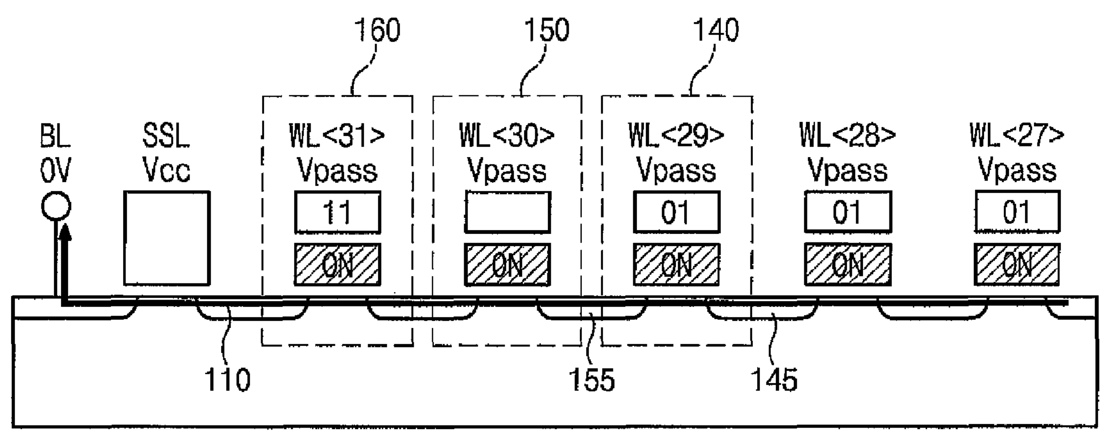
FIGS. 4 and 5 are diagrams showing discharge paths of a channel voltage boosted in A and B intervals illustrated in FIG. 3, according to an exemplary embodiment of the present invention.
Figure 5:
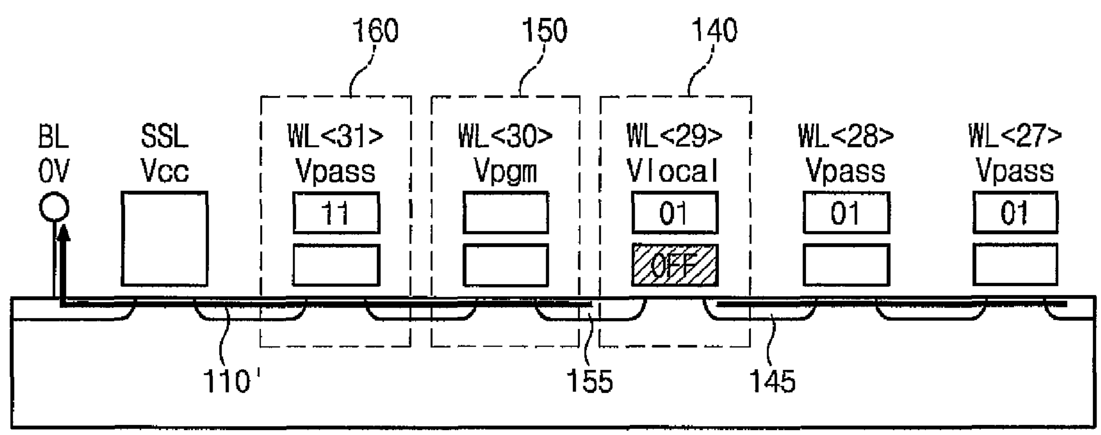

FIG. 3 is a diagram showing a word line voltage application method of a flash memory device during a program operation, according to an exemplary embodiment. In FIG. 3, a channel boosting result Vbc of floating gate transistors (i.e., memory cells) connected to a selected bit line is illustrated. FIGS. 4 and 5 are diagrams showing discharge paths of a channel voltage boosted in the A and B intervals illustrated in FIG. 3.

Referring to FIGS. 2 and 3, according to a program method of an embodiment of the present invention, a bit line voltage of 0V may be applied to a selected bit line BL2, which is the bit line connected to a memory cell to be programmed (e.g., the memory cell 150, corresponding to the floating gate transistor M30 connected to the word line WL <30>). A power supply voltage may be applied to an unselected bit line BL1, which is the bit line connected to a memory cell which is to be program-inhibited. During interval A, a pass voltage Vpass (e.g., 10V) is supplied to multiple word lines WL<0> to WL<31>, including a selected word line, which is word line WL<30> in the depicted example. During interval B, a program voltage Vpgm is applied to the selected word line WL<30>.

Referring to FIGS. 3 and 4, during interval A, memory cells connected to the word lines WL<0> to WL<31> are turned on by the pass voltage Vpass applied to corresponding control gates. The pass voltage Vpass is higher than all threshold voltages corresponding to program states "11", "10", "01" or "00". Therefore, memory cells connected to word lines WL<0> to WL<31> may be turned on regardless of program states. At this time, channel voltages of memory cells may be boosted up to Vpass*α. However, as a time elapses, the boosted channel voltage Vbc is discharged slowly along a bit line connected to a ground voltage (indicated by a discharge path 110 in FIG. 4). In particular, a channel voltage of a selected memory cell may be discharged via a channel of another (e.g., lower) memory cell connected in the same string.

As illustrated in FIG. 4, memory cells in the same string may share source-drain terminals of the respective cell transistors with adjacent memory cells. Accordingly, when the memory cells are turned on, no voltage difference exists between a source and a drain of adjacent memory cells. Therefore, when a memory cell 150 is to be programmed, for example, there is no leakage current due to a source-drain voltage difference of an adjacent memory cell (e.g., memory cell 140 or memory cell 160).

Flash memory devices may be configured to carry out a program operation from a lowermost memory cell to an uppermost memory cell. Accordingly, a threshold voltage of the memory cell 140, which is located below the memory cell 150 to be programmed, may be increased by the program voltage Vpgm applied during the immediately preceding program operation. When a source-drain voltage difference between adjacent memory cells is not removed during interval A, leakage current may arise, due to a voltage difference between source 145 and drain 155 of the lower adjacent cell 140, in the memory cell 150 to be programmed when the program voltage Vpgm is applied. The leakage current may cause a hot electron injection phenomenon, which affects a program operation of the memory cell. However, in accordance with the present embodiment, as described above, the source-drain voltage differences between adjacent memory cells (e.g., memory cells 140 and 150 and memory cells 150 and 160) is removed during the interval A, preventing the generation of leakage current.

Also in accordance with the present embodiment, during interval B, a program voltage Vpgm is applied to the selected word line WL<30> and a local voltage Vlocalj is simultaneously applied to at least one word line (e.g., WL<29>), adjacent to the selected word line WL<30>. This bias condition enables the local boosting effect to be generated. At this time, a pass voltage Vpass is applied to the remaining word lines, which are not supplied with the program voltage Vpgm or the local voltage Vlocalj. In particular, since the pass voltage Vpass is continuously supplied to the adjacent word line WL<31>, located above the selected word line WL<30>, it is possible to prevent a decrease in channel potential (e.g., F-poly potential) of the memory cell 150. This means that the program operation is carried out at a high speed. In the depicted embodiment, the local voltage Vlocalj is lower than the pass voltage Vpass, and equal to or higher than a ground voltage.

Referring to FIGS. 3 and 5, the memory cell 140, supplied with the local voltage Vlocalj during interval B, is shut off due to a low gate voltage. A channel of the memory cell 150, supplied with the program voltage Vpgm during interval B, is electrically isolated from a channel of the memory cell 140. The memory cell 150 is therefore cut off from the flow of current supplied to the memory cell 140, which is adjacent to a source and/or a drain of the memory cell 150 to be programmed. The memory cell 150 is programmed at this time.

While the memory cell 150 is being programmed, a voltage difference between the source 145 and the drain 155 of the memory cell 140 below the selected memory cell 150 is sufficiently low so as not to exceed a discharge voltage Vdischarge discharged via a bit line. Therefore, the source-drain voltage difference of the memory cell 140 is sufficiently low so as not to affect the program operation of the selected memory cell 150. Accordingly, it is possible to effectively prevent generation of leakage current and the program disturbance phenomenon due to a source-drain voltage difference of an adjacent memory cell (e.g., the memory cell 140). The present embodiment is thus more effective for narrow channel widths and high integration.

FIGS. 6 to 15 are diagrams showing exemplary word line voltage application methods of a flash memory device according to embodiments of the present invention.

Figure 6:
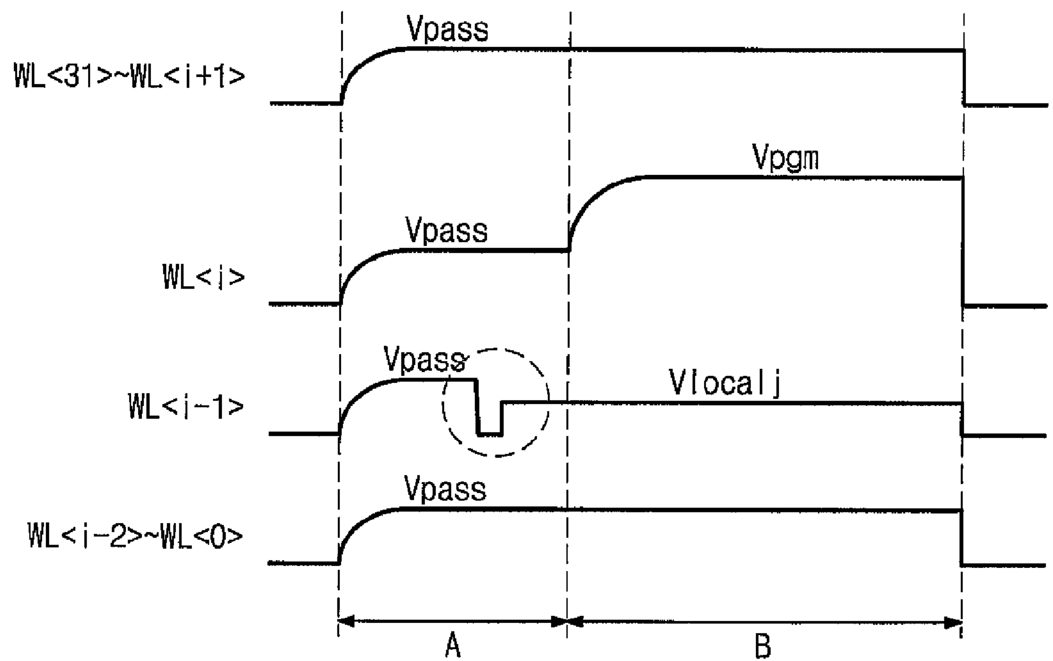
FIGS. 6 to 15 are diagrams showing exemplary word line voltage application methods of a flash memory device, according to exemplary embodiments of the present invention.

FIG. 6 illustrates a modified embodiment of the word line voltage application method described with respect to FIG. 3. Referring to FIG. 6, during an interval A, a pass voltage Vpass, applied to a lower word line WL<i−1> adjacent to a selected word line WL<i>, is rapidly lowered to a first level (higher than 0V). The voltage level is then changed to a local voltage Vlocalj having a second level (indicated by the dashed circle in FIG. 6), which is applied during an interval B. In alternative embodiments, the voltage level may change to the local voltage Vlocalj before or during the interval B. By applying voltage in this manner, a pass voltage Vpass is changed to a local voltage Vlocalj within a short time. Accordingly, it is possible to change the voltage applied to the word line WL<i−1> more rapidly.

Figure 7:
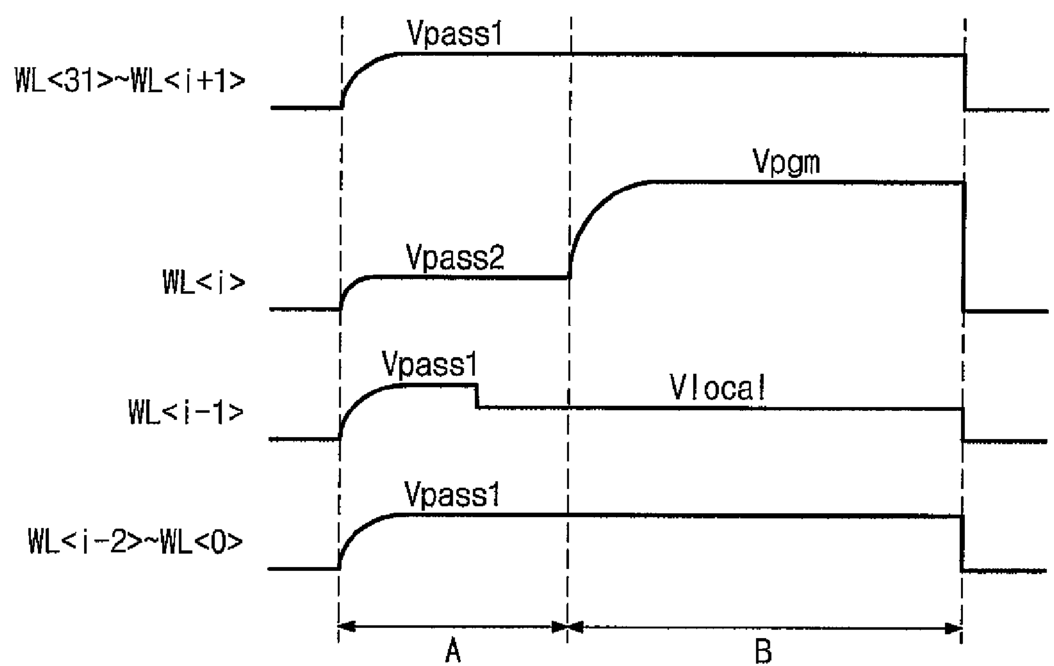

FIG. 7 illustrates a modified embodiment of the word line voltage application method described with respect to FIG. 3. As indicated by FIG. 7, pass voltages Vpass1 and Vpass2, applied to word lines during an interval A, are different from each other. For example, the pass voltage Vpass2, applied to a selected word line WL<i>, is less than the pass voltage Vpass1 applied to the remaining word lines. With this bias condition, program disturbance is prevented and booting efficiency of a program voltage Vpgm is increased.

Figure 8:
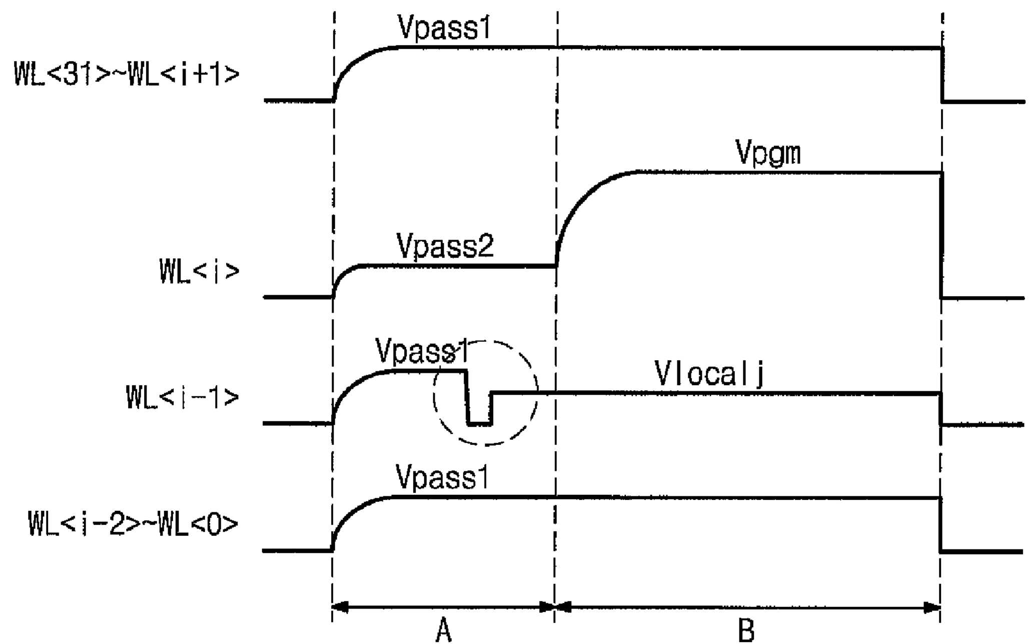

FIG. 8 illustrates a modified embodiment of the word line voltage application method described in FIG. 7. Referring to FIG. 8, the pass voltage Vpass2, applied to a selected word line WL<i>, is less than the pass voltage Vpass1 applied to the remaining word lines. During an interval A, a the pass voltage Vpass1, applied to a lower word line WL<i−1> adjacent to the selected word line WL<i>, is rapidly lowered to a first level (e.g., a ground voltage). The voltage level applied to the word line WL<i−1> is the changed to a local voltage Vlocalj having a second level (indicated by the dashed circle in FIG. 8), to be applied during an interval B. By applying voltages in this manner, a pass voltage Vpass1 is changed to a local voltage Vlocalj within a short time. As illustrated in FIG. 8, during the intervals A and B, a word line WL<i+1> located above the selected word line WL<i> is continuously supplied with the pass voltage Vpass1. Accordingly, it is possible to prevent a decrease in channel potential of the memory cell 150 to be programmed, and to secure a high-speed program operation.

Figure 9:
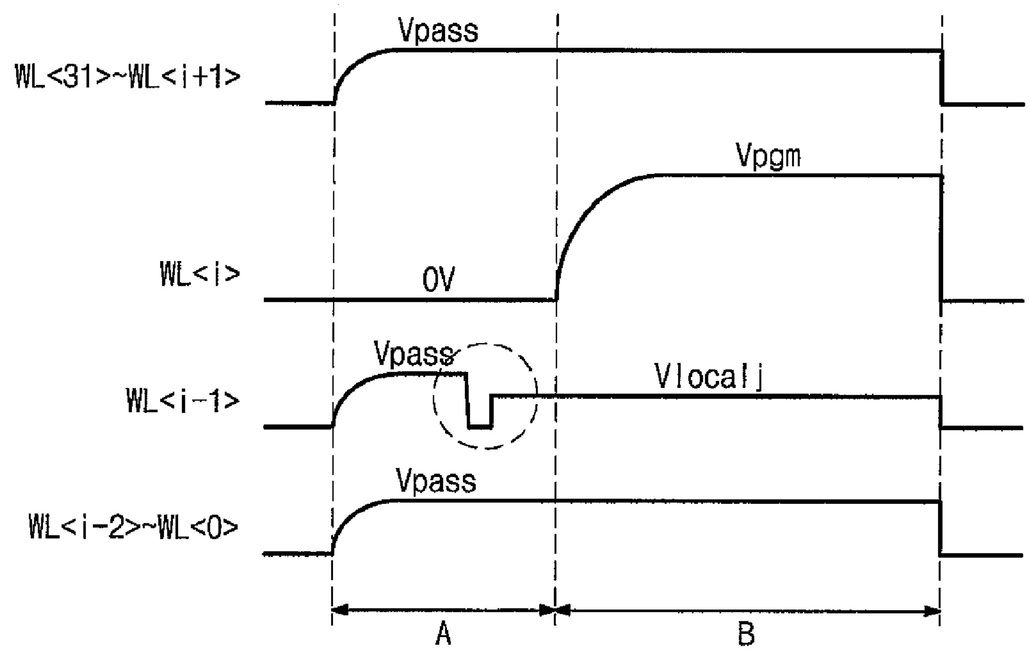

FIG. 9 illustrates a modified embodiment of the word line voltage application method described with respect to FIG. 3. FIG. 9 illustrates an exemplary method in which a ground voltage 0V is initially applied to a selected word line WL<i> during an interval A, instead of a pass voltage Vpass. By applying the ground voltage to the selected word line WL<i> instead of the pass voltage Vpass, boosting efficiency of a program voltage Vpgm is further increased. Also, in this example, the pass voltage Vpass applied to a lower word line W<i−1>, adjacent to the selected word line WL<i>, is rapidly dropped and then changed to a local voltage Vlocalj (indicated by the dashed circle in FIG. 9).

Figure 10:
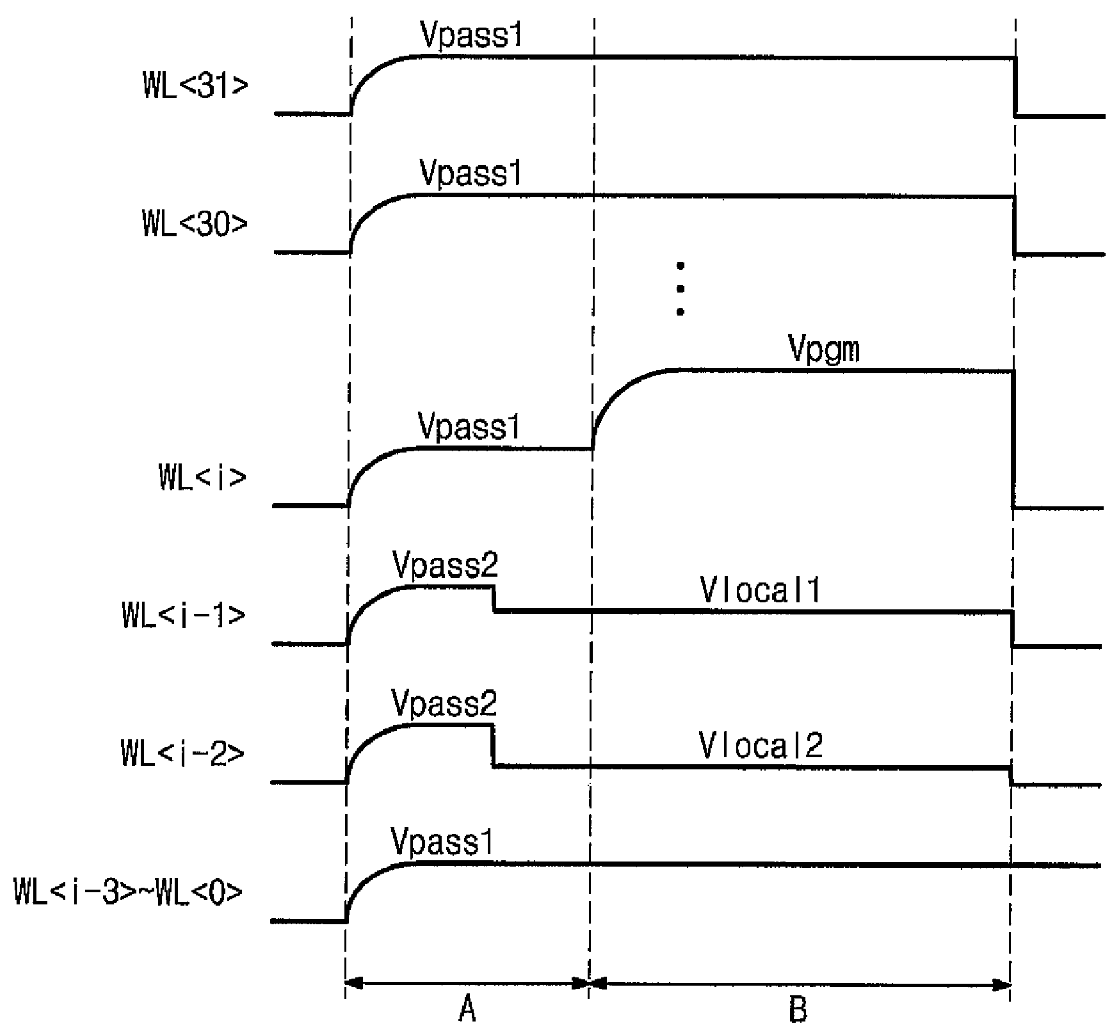

FIG. 10 illustrates a modified embodiment of the word line voltage application method described with respect to FIG. 3. Referring to FIG. 10, during an interval A, pass voltages Vpass1 and Vpass2 are applied to word lines WL<0> to WL<31> including a selected word line WL<i>. In particular, the pass voltage Vpass2 is applied to at least two or more lower word lines WL<i−1> and WL<i−2> adjacent to the selected word line WL<i>. The pass voltage Vpass 2 has a different voltage level (e.g., a lower voltage level) from the pass voltage Vpass1, which is applied to other word lines. The pass voltages Vpass1 and Vpass2 may vary in level within a range of an allowable pass voltage, without departing from the spirit and scope of the present invention.

During an interval B, and local voltages Vlocal1 and Vlocal 2 are continuously applied to the lower adjacent word lines WL<i−1> and WL<i−2>. While the local voltages Vlocal1 and Vlocal2 are applied, a program voltage Vpgm is applied to the selected word line WL<i> and the pass voltage Vpass1 is applied to the remaining word lines. The local voltages Vlocal1 and Vlocal2 applied to the lower adjacent word lines WL<i−1> and WL<i−2> during the interval B may be set to have the same or different levels. Also, the local voltages Vlocal1 and Vlocal2 may be changed to have voltage levels between a ground voltage and a pass voltage Vpass. In this manner, it is possible to better secure a local-boosting region and to effectively prevent punch-though phenomenon.

Figure 11:
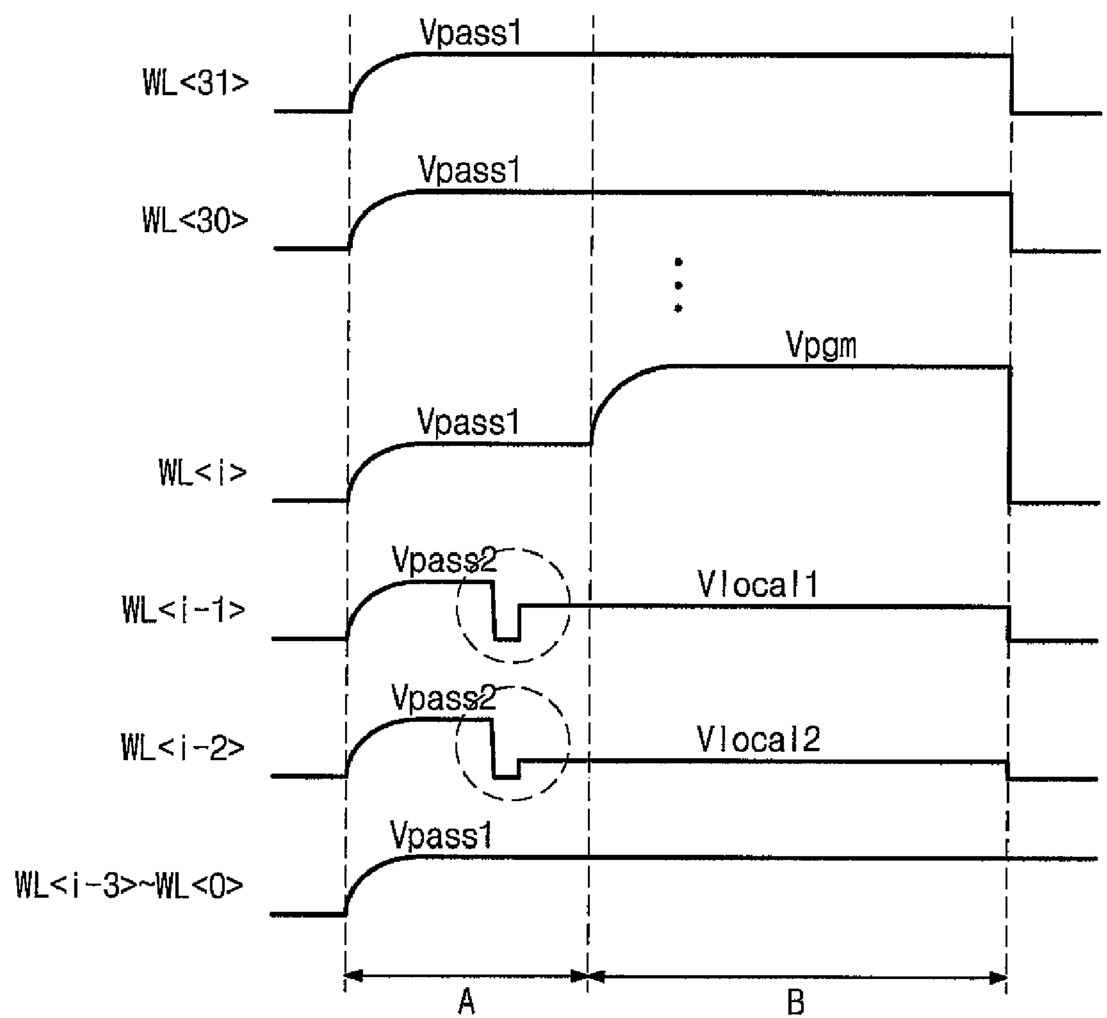

FIG. 11 illustrates a modified embodiment of the word line voltage application method described in FIG. 10. Referring to FIG. 11, during an interval A, a pass voltage Vpass2, applied to lower word lines WL<i−1> and WL<i−2> adjacent to a selected word line WL<i>, is rapidly dropped to a first level (e.g., a ground voltage), and then changed to local voltages Vlocal1 and Vlocal2, respectively, having second and third levels (indicated by the dashed circle in FIG. 11), to be applied during an interval B. Changing the pass voltage Vpass2 into the local voltages Vlocal1 and Vlocal2 is performed within a short time. In this manner, it is possible to prevent program disturbance and to secure a local-boosting region.

Figure 12:
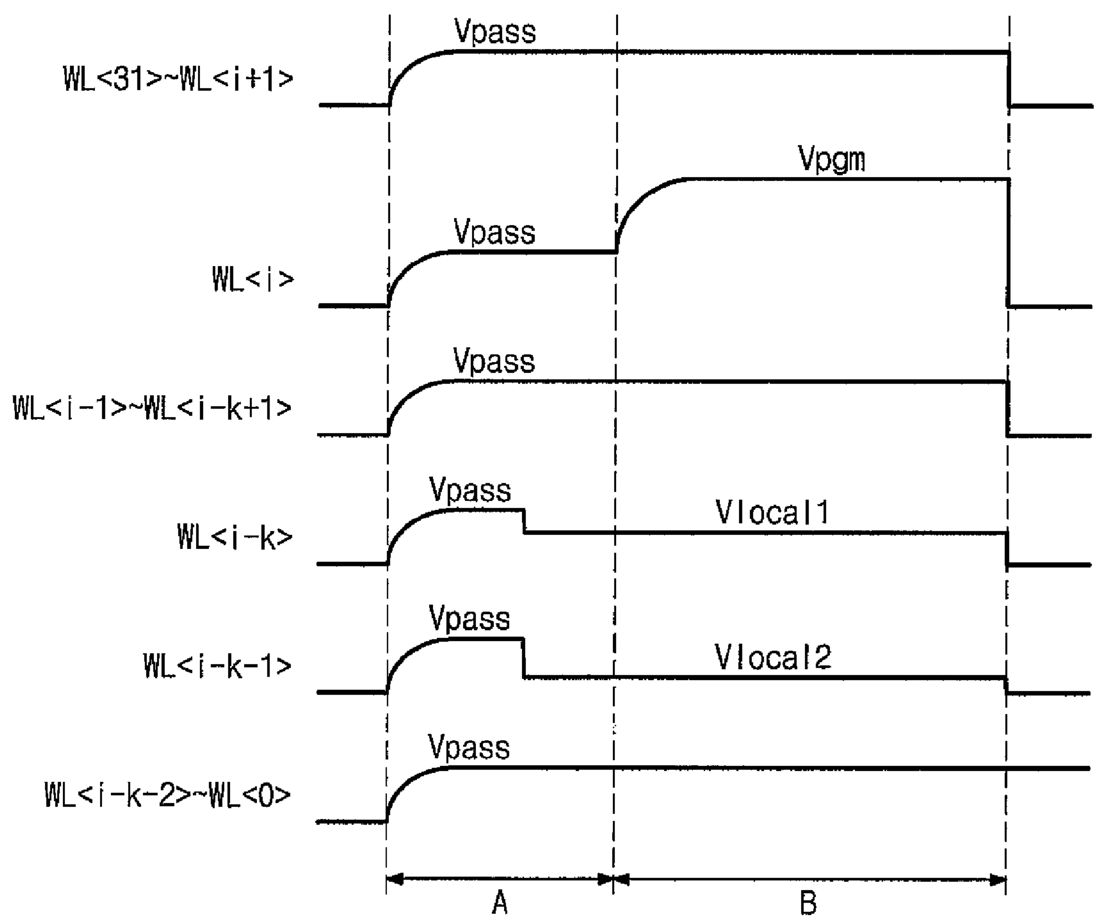

FIG. 12 illustrates a modified embodiment of the word line voltage application method described with respect to FIG. 3. Referring to FIG. 12, during an interval A, a pass voltage Vpass is applied to multiple word lines WL<0> to WL<31>, including a selected word line WL<i>. During an interval B, a program voltage Vpgm is applied to the selected word line WL<i>. Meanwhile, local voltages Vlocal1 and Vlocal2 are applied to one or more word lines WL<i−k> and WL<i−k−1> separate from and not adjacent to the selected word line WL<i>, and the pass voltage Vpass is applied to other word lines WL<31> to WL<i+1>, WL<i−1> to WL<i−k+1> and WL<i−k−2> to WL<0>. The local voltages Vlocal1 and Vlocal2 applied during the interval B may be set to have the same or different levels. In this manner, it is possible to prevent program disturbance and to arbitrarily change a local-boosting region.

Figure 13:
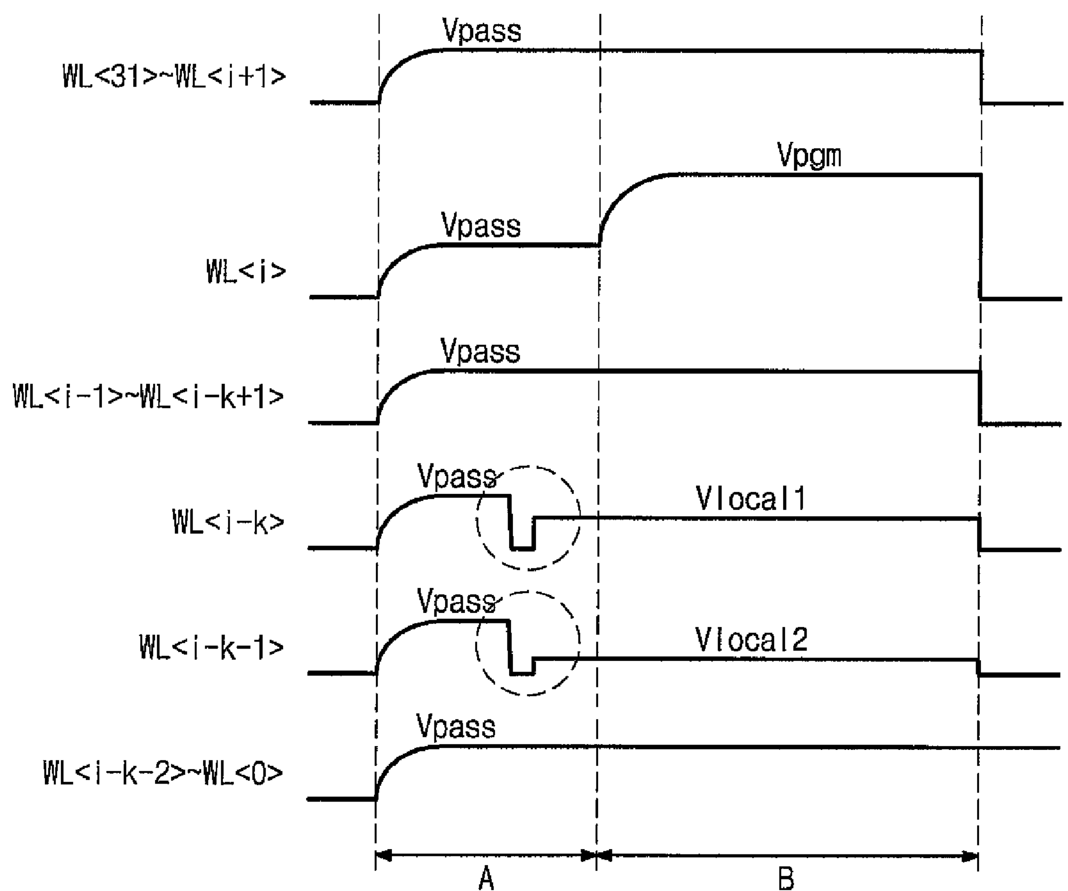

FIG. 13 illustrates a modified embodiment of the word line voltage application method described in FIG. 12. Referring to FIG. 13, a pass voltage Vpass applied to word lines WL<i−k> and WL<i−k−1>, which are not adjacent to the selected word line WL<i>, is rapidly dropped into a first level (e.g., a ground voltage) during an interval A. The voltage applied to the word lines WL<i−k> and WL<i−k−1> is changed to local voltages Vlocal2 and Vlocal3, having second and third levels, respectively (indicated by the dashed circle in FIG. 13), which are applied during an interval B. In this manner, it is possible to arbitrarily change a local-boosting region. Further, it is possible to change the pass voltage Vpass to the local voltages Vlocal1 and Vlocal2 more quickly.

Figure 14:
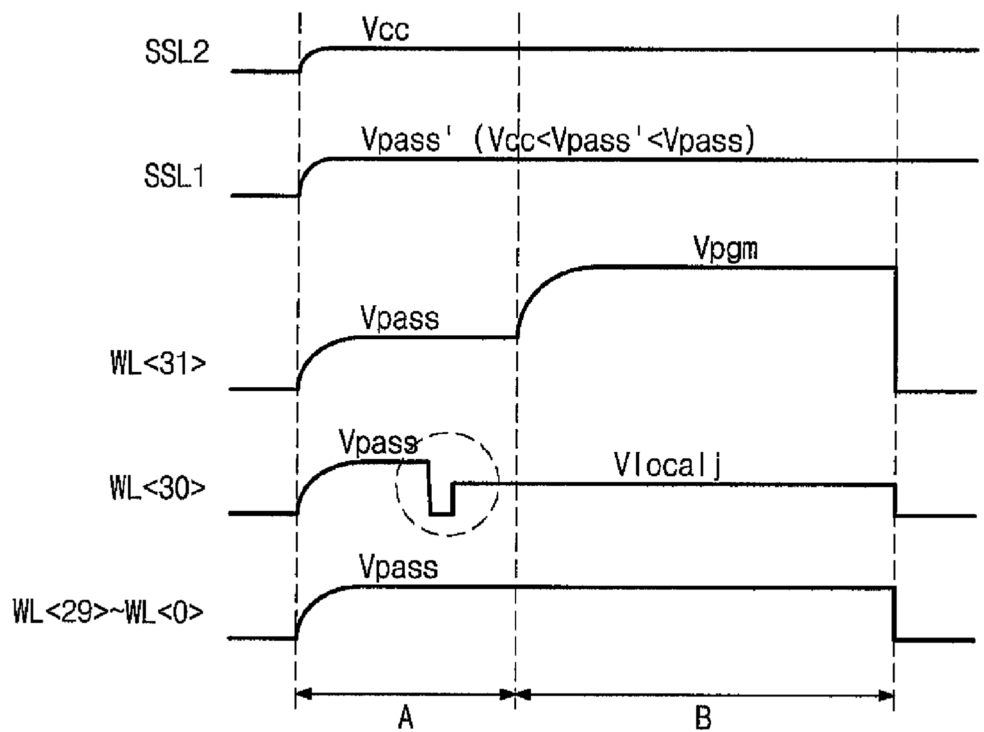

FIG. 14 illustrates a modified embodiment of the word line voltage application method described with respect to FIG. 3. In particular, FIG. 14 illustrates a word line voltage application method for programming a memory cell connected to an uppermost word line.

Referring to FIG. 14, a flash memory device according to an embodiment of the present invention includes multiple string select transistors SSL1 and SSL2. During an interval A, a pass voltage Vpass' is applied to the string select transistor SSL1, which is adjacent to the uppermost word line WL<31>, when the memory cell connected to the uppermost word line WL31 is to be programmed. A power supply voltage Vcc is applied to the other string select transistor SSL2. During the interval A, a pass voltage Vpass is applied to multiple word lines WL<0> to WL<31>, including the selected uppermost word line WL<31>.

In general, each of the string select transistors SSL1 and SSL2 may be a low-voltage transistor. Accordingly, the pass voltage Vpass' applied to the string select transistor SSL1 during the interval A is lower than the pass voltage Vpass applied to the word lines WL<0> to WL<31>. It is therefore possible to reduce a channel voltage difference between the word line WL<31>, supplied with a program voltage Vpgm during an interval B, and an adjacent string select transistor SSL1. Meanwhile, the pass voltage Vpass, applied to a lower word line WL<30> adjacent to the selected word line WL<31> during the interval A, is rapidly dropped to a first level (e.g., a ground voltage) and then changed to a local voltage Vlocalj having a second level (indicated by the dashed circle in FIG. 14), to be during the interval B. In this manner, it is possible to effectively prevent a program disturbance phenomenon with respect to the uppermost word line WL<31>.

Figure 15:
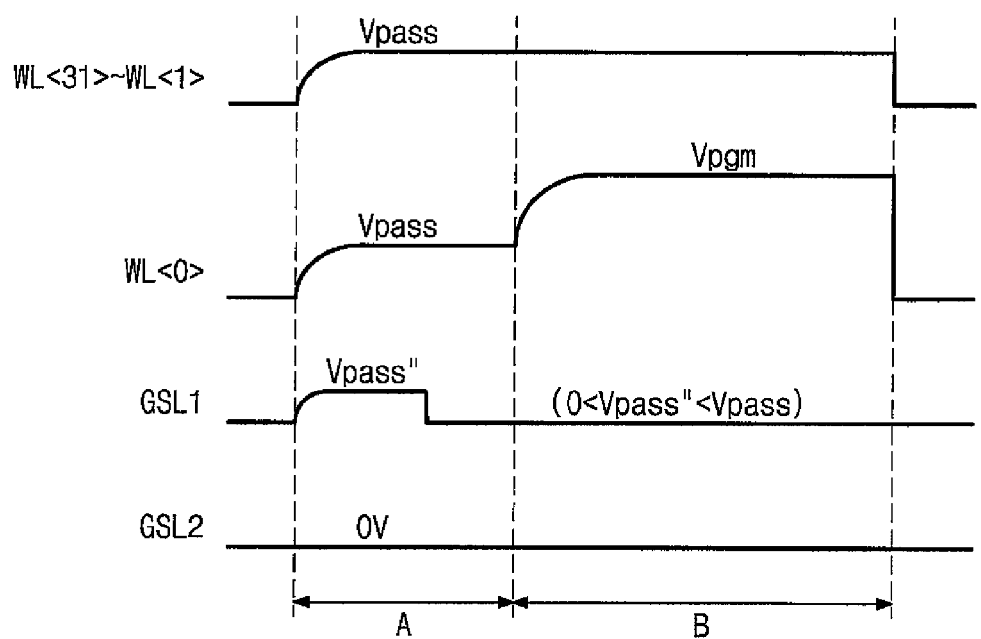

FIG. 15 illustrates a modified embodiment of the word line voltage application method described with respect to FIG. 3. In particular, FIG. 15 illustrates a word line application method for programming a memory cell connected to a lowermost word line.

Referring to FIG. 15, a flash memory device according to the present embodiment includes multiple ground select transistors GSL1 and GSL2. During an interval A, a pass voltage Vpass" is applied to the ground select transistor GSL1, which is adjacent to the lowermost word line WL<0>, when the memory cell connected to the lowermost word line WL0 is to be programmed. A ground voltage is applied to the other ground select transistor GSL2. During the interval A, a pass voltage Vpass is applied to multiple word lines WL<0> to WL<31>, including the selected lowermost word line WL<0>.

In general, each of the ground select transistors GSL1 and GSL2 may be a low-voltage transistor. Accordingly, the pass voltage Vpass" applied to the ground select transistor GSL1 during the interval A is lower than the pass voltage Vpass applied to the word lines WL<0> to WL<31>. That is, the pass voltage Vpass" is equal to or higher than a ground voltage, and is lower than the pass voltage Vpass. It therefore is possible to reduce a channel voltage difference between a word line WL<0> supplied with a program voltage Vpgm and an adjacent ground select transistor GSL1. Meanwhile, the pass voltage Vpass" applied to a ground select transistor GSL1 during the interval A is rapidly dropped to a ground voltage. In this manner, it is possible to effectively prevent a program disturbance phenomenon with respect to the lowermost word line WL<0>.

As described above, a flash memory device according to embodiments of the present invention is configured to apply a pass voltage Vpass or Vpassi to multiple word lines, including a selected word line, when a program operation commences. A program voltage is then applied to the selected word line, while a local voltage Vlocal or Vlocalj is applied to at least one or more word lines adjacent to the selected word line at the same time. The local voltage Vlocalj is lower than the pass voltage Vpass or Vpassi, and the same as or higher than a ground voltage. In this manner, no voltage difference between a channel of the memory cell to be programmed and an adjacent memory cell may arise, preventing a program disturbance, such as a soft program operation.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A program method of a flash memory device, comprising:

applying a pass voltage to a plurality of word lines to boost a channel voltage;

discharging the channel voltage boosted by the pass voltage;

applying a program voltage to a selected word line of the plurality of word lines; and applying a local voltage to at least one word line of the plurality of word lines supplied with the pass voltage, while applying the program voltage to the selected word line, wherein the local voltage is lower than the pass voltage and equal to or higher than a ground voltage.

2. The program method of claim 1, further comprising:

before applying of the pass voltage, applying the ground voltage to a selected bit line and a power supply voltage to an unselected bit line.

3. The program method of claim 2, wherein the boosted channel voltage is discharged to the ground voltage before the program voltage is applied to the selected word line.

4. The program method of claim 1, wherein the at least one word line to which the local voltage is applied comprises a word line adjacent to the selected word line.

5. The program method of claim 1, wherein the at least one word line to which the local voltage the local voltage is applied comprises at least one word line positioned below the selected word line.

6. The program method of claim 1, wherein applying the local voltage comprises:

initially lowering the pass voltage to a level lower than the local voltage; and increasing the lowered voltage to the local voltage to apply to the at least one word line.

7. The program method of claim 6, wherein the lowered voltage is lower than the local voltage and equal to or higher than the ground voltage.

8. The program method of claim 1, wherein applying the local voltage to the at least one word line comprises:

applying a first local voltage having a first voltage level to a first word line; and applying a second local voltage having a second voltage level, different from the first voltage level, to a second word line.

9. The program method of claim 1, wherein applying the local voltage to the at least one word line comprises:

applying the local voltage having the same voltage level to a first word line and a second word line.

10. The program method of claim 1, wherein applying the pass voltage to the plurality of word lines comprises:

applying the pass voltage to at least one of the word lines at a pass voltage level different than a pass voltage level applied to at least one other word line.

11. The program method of claim 1, wherein applying the pass voltage to the plurality of word lines comprises:

applying the pass voltage to the selected word line at a pass voltage level lower than or equal to a pass voltage level applied the other word lines of the plurality of word lines.

12. The program method of claim 1, wherein applying the pass voltage to the plurality of word lines comprises:

applying the pass voltage to the selected word line at a pass voltage level lower than a pass voltage level applied to the other word lines of the plurality of word lines, and equal to or higher than the ground voltage.

13. The program method of claim 1, wherein a pass voltage level of the pass voltage applied to the plurality of word lines is the same for each of the plurality of word lines.

14. The program method of claim 1, wherein the pass voltage is continuously applied to word lines of the plurality of word lines positioned over the selected word line.

15. The program method of claim 1, wherein when the selected word line comprises an uppermost word line in a string, the method further comprising:

supplying a first string select transistor adjacent to the selected word line with a voltage higher than a power supply voltage and lower than the pass voltage before applying the program voltage; and supplying a second string select transistor adjacent to the first string select transistor with the power supply voltage.

16. The program method of claim 1, wherein when the selected word line comprises a lowermost word line in a string, the method further comprising:

supplying a first ground select transistor adjacent to the selected word line with a voltage higher than the ground voltage and lower than the pass voltage before applying the program voltage; and supplying a second ground select transistor adjacent to the first ground select transistor with the ground voltage.

17. A flash memory device, comprising:

a memory cell array comprising a plurality of memory cells positioned at intersections of a plurality of bit lines and a plurality of word lines;

a control circuit for controlling generation and application of a plurality of high voltages to the memory cell array;

a high voltage generator circuit for generating the plurality of high voltages in response to the control circuit, the plurality of high voltages comprising a program voltage, a pass voltage lower than the program voltage, and a local voltage lower than the pass voltage and higher than or equal to a ground voltage; and a row selector circuit for applying the plurality of high voltages to the memory cell array in response to the control circuit, wherein applying the plurality of high voltages comprises applying the pass voltage to the plurality of word lines to boost a channel voltage, applying the program voltage to a selected word line after the boosted channel voltage is discharged, and applying a local voltage to at least one word line of the plurality of word lines while the program voltage is applied.

18. The flash memory device of claim 17, wherein the local voltage is lower than the pass voltage and equal to or higher than the ground voltage.

19. The flash memory device of claim 17, further comprising:

a column selector circuit for applying the ground voltage to a selected bit line and a power supply voltage to an unselected bit line before the pass voltage is applied.

20. The flash memory device of claim 19, wherein the boosted channel voltage is discharged to the ground voltage before the program voltage is applied to the selected word line.

21. The flash memory device of claim 17, wherein the memory cell array further comprises a plurality of strings, each string comprising memory cells of the plurality of memory cells that share a source-drain terminal and that are turned on in response to the pass voltage before the program voltage is applied.

22. The flash memory device of claim 21, wherein before the program voltage is applied, a boosted result of a memory cell connected to the selected word line is discharged via a channel of an adjacent memory cell sharing the source-drain terminal.

23. The flash memory device of claim 17, wherein applying the local voltage to the at least one word line of the plurality of word lines comprises applying the local voltage to a word line adjacent to the selected word line.

24. The flash memory device of claim 17, wherein applying the local voltage to the at least one word line of the plurality of word lines comprises applying the local voltage to one or more word lines positioned below the selected word line.

25. The flash memory device of claim 17, wherein applying the local voltage to the at least one word line of the plurality of word lines comprises initially applying an initial local voltage, lower than the local voltage, and increasing the initial local voltage to the local voltage.

26. The flash memory device of claim 25, wherein the initial local voltage is lower than the local voltage and equal to or higher than the ground voltage.

27. The flash memory device of claim 17, wherein applying the local voltage to the at least one word line of the plurality of word lines comprises applying at least two different voltage levels to at least two different word lines, respectively.

28. The flash memory device of claim 17, wherein applying the local voltage to the at least one word line of the plurality of word lines comprises applying the same voltage level to at least two different word lines.

29. The flash memory device of claim 17, wherein applying the pass voltage to the plurality of word lines comprises applying at least two different voltage levels to at least two different word lines, respectively.

30. The flash memory device of claim 17, wherein applying the pass voltage to the plurality of word lines comprises applying a voltage level to the selected word line that is equal to or lower than a voltage level applied to the other word lines of the plurality of word lines.

31. The flash memory device of claim 17, wherein applying the pass voltage to the plurality of word lines comprises applying the same voltage level to each of the plurality of word lines.

32. The flash memory device of claim 17, wherein the pass voltage is continuously applied to word lines of the plurality of word lines positioned above the selected word line.

33. The flash memory device of claim 17, wherein when the selected word line comprises an uppermost word line, the row selector circuit applies a voltage higher than a power supply voltage and lower than the pass voltage to a first string select transistor adjacent to the selected word line, and applies the power supply voltage to a second string select transistor adjacent to the first string select transistor, before applying the program voltage.

34. The flash memory device of claim 17, wherein when the selected word line comprises a lowermost word line, the row selector circuit applies a voltage higher than a ground voltage and lower than the pass voltage to a first ground select transistor adjacent to the selected word line, and applies the ground voltage to a second ground select transistor adjacent to the first ground select transistor, before the program voltage is applied.

* * * * *